(12) United States Patent
Lee et al.

(10) Patent No.: US 12,198,971 B2
(45) Date of Patent: Jan. 14, 2025

(54) SUBSTRATE PROCESSING APPARATUS

(71) Applicant: SEMES CO., LTD., Cheonan-si (KR)

(72) Inventors: Jeongcheol Lee, Incheon-si (KR);
Jungheum Nam, Gyeongju-si (KR);
Kyungmo Kim, Asan-si (KR); Woojin Chung, Seongnam-si (KR);
Myunggeun Min, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 79 days.

(21) Appl. No.: 18/069,478

(22) Filed: Dec. 21, 2022

(65) Prior Publication Data
US 2024/0213077 A1    Jun. 27, 2024

(30) Foreign Application Priority Data
Dec. 31, 2021 (KR) .......................... 10-2021-0194466

(51) Int. Cl.
*H01L 21/687* (2006.01)
*H01L 21/67* (2006.01)
*H05F 3/04* (2006.01)

(52) U.S. Cl.
CPC .. *H01L 21/68742* (2013.01); *H01L 21/67051* (2013.01); *H01L 21/68764* (2013.01); *H05F 3/04* (2013.01)

(58) Field of Classification Search
None
See application file for complete search history.

(56) References Cited

U.S. PATENT DOCUMENTS

| | | | |
|---|---|---|---|
| 9,027,577 B2 | 5/2015 | Osada et al. | |
| 11,804,371 B2 | 10/2023 | Kim et al. | |
| 2008/0251107 A1* | 10/2008 | Osada | H01L 21/67051 134/201 |
| 2020/0168478 A1 | 5/2020 | Jung et al. | |

(Continued)

FOREIGN PATENT DOCUMENTS

| | | |
|---|---|---|
| JP | 2008-118109 A | 5/2008 |
| JP | 2017-069552 A | 4/2017 |

(Continued)

OTHER PUBLICATIONS

Korean Office Action dated Aug. 30, 2023 issued in corresponding Korean Patent Application No. 10-2021-0194466.

(Continued)

*Primary Examiner* — Natasha N Campbell
(74) *Attorney, Agent, or Firm* — HARNESS, DICKEY & PIERCE, P.L.C.

(57) ABSTRACT

There is provided a substrate processing apparatus. The substrate processing apparatus may include a substrate supporter supporting a substrate, a processing solution feeder supplying a processing solution to the substrate, first and second recovery containers configured to recover the processing solution, a first pipe connected to the first recovery container and including an insulating material, a second pipe connected to the second recovery container and including an insulating material, a first static electricity eliminator in contact with the first pipe, a second static electricity eliminator in contact with the second pipe, and a plurality of first conductive lines connected to the first and second static electricity eliminators.

15 Claims, 5 Drawing Sheets

(56) References Cited

U.S. PATENT DOCUMENTS

2021/0013029 A1\* 1/2021 Kim .................... H01L 21/6715
2021/0360767 A1\* 11/2021 Kim ......................... H05F 3/02

FOREIGN PATENT DOCUMENTS

| JP | 2019-029492 A | 2/2019 |
| JP | 2021-013019 A | 2/2021 |
| KR | 10-2017-0137238 A | 12/2017 |
| KR | 10-1966814 | 8/2019 |
| KR | 10-2020-0062831 A | 6/2020 |
| KR | 10-2021-0008599 A | 1/2021 |

OTHER PUBLICATIONS

Japanese Office Action dated Mar. 5, 2024 issued in corresponding Japanese Appln. No. 2022-201229.

\* cited by examiner

SUBSTRATE PROCESSING APPARATUS

CROSS-REFERENCE TO RELATED APPLICATION

This application is based on and claims priority under 35 U.S.C. § 119 to Korean Patent Application No. 10-2021-0194466, filed on Dec. 31, 2021, in the Korean Intellectual Property Office, the disclosure of which is incorporated by reference herein in its entirety.

BACKGROUND

1. Field

The disclosure relates to a substrate processing apparatus.

2. Description of the Related Art

Contaminants such as particles, organic residues, and metal residues remaining on a substrate surface greatly affect the characteristics and production yield of semiconductor devices. A process of removing contaminants on a substrate surface is referred to as a cleaning process. The cleaning process is a key factor in a semiconductor manufacturing process, and is performed before and after each unit process for manufacturing a semiconductor device.

The cleaning process includes processes of applying various processing solutions onto a semiconductor substrate, and processing solutions used in the cleaning process are recovered by pipes connected to recovery containers of cleaning equipment.

SUMMARY

Provided is a substrate processing apparatus with improved reliability.

Additional aspects will be set forth in part in the description which follows and, in part, will be apparent from the description, or may be learned by practice of the presented embodiments of the disclosure.

According to an aspect of the disclosure, there is provided a substrate processing apparatus. The substrate processing apparatus may include a substrate supporter including a support plate configured to support a plate and a rotary actuator configured to rotate the support plate, a processing solution feeder configured to supply a processing solution to the substrate, a first recovery container surrounding the substrate supporter and configured to recover the scattered processing solution from the substrate, a second recovery container surrounding the first recovery container and configured to recover the scattered processing solution from the substrate, a lift actuator configured to move the first and second recovery containers up and down with respect to the substrate supporter, a first pipe connected to the first recovery container and including an insulating material, a second pipe connected to the second recovery container and including an insulating material, a first static electricity eliminator in contact with the first pipe, a second static electricity eliminator in contact with the second pipe, and a plurality of first conductive lines connected to the first and second static electricity eliminators.

According to another aspect of the disclosure, there is provided a substrate processing apparatus. The substrate processing apparatus may include a substrate supporter supporting a substrate, a processing solution feeder including a nozzle configured to supply a processing solution to the substrate, a first recovery container surrounding the substrate supporter and configured to recover the scattered processing solution from the substrate, a second recovery container surrounding the first recovery container and configured to recover the scattered processing solution from the substrate, a first pipe connected to the first recovery container and including an insulating material, a second pipe connected to the second recovery container and including an insulating material, and a first static electricity eliminator configured to remove electrostatic charges generated by the first pipe, wherein the first static electricity eliminator may include a conductive material, may surround a bent portion of the first pipe, and may be in contact with the bent portion of the first pipe.

The substrate processing substrate may include a substrate supporter including a support plate configured to support a substrate and a rotary actuator configured to rotate the support plate, a processing solution feeder configured to supply a processing solution to the substrate, a first recovery container surrounding the substrate supporter and configured to recover the scattered processing solution from the substrate, a second recovery container surrounding the first recovery container and configured to recover the scattered processing solution from the substrate, a third recovery container surrounding the second recovery container and configured to recover the scattered processing solution from the substrate, a lift actuator configured to move the first to third recovery containers up and down with respect to the substrate supporter, a first pipe connected to the first recovery container and including an insulating material, a second pipe connected to the second recovery container and including an insulating material, a third pipe connected to the third recovery container and including a conductive material, a first static electricity eliminator in contact with a bent portion of the first pipe, a second static electricity eliminator in contact with a bent portion of the second pipe, a plurality of first conductive lines providing a path for discharging electrostatic charges to the first and second static electricity eliminators and the third pipe, a plurality of second conductive lines configured to provide a ground potential for operating the rotary actuator and the lift actuator to the rotary actuator and the lift actuator, a first ground bar connected to the plurality of first conductive lines, a second ground bar connected to the plurality of second conductive lines and apart from the first ground bar, a third conductive line connected to the first ground bar, a fourth conductive line connected to the second ground bar, a third ground bar connected to the third conductive line and the fourth conductive line, and a fifth conductive line connecting the third ground bar to an earth ground.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
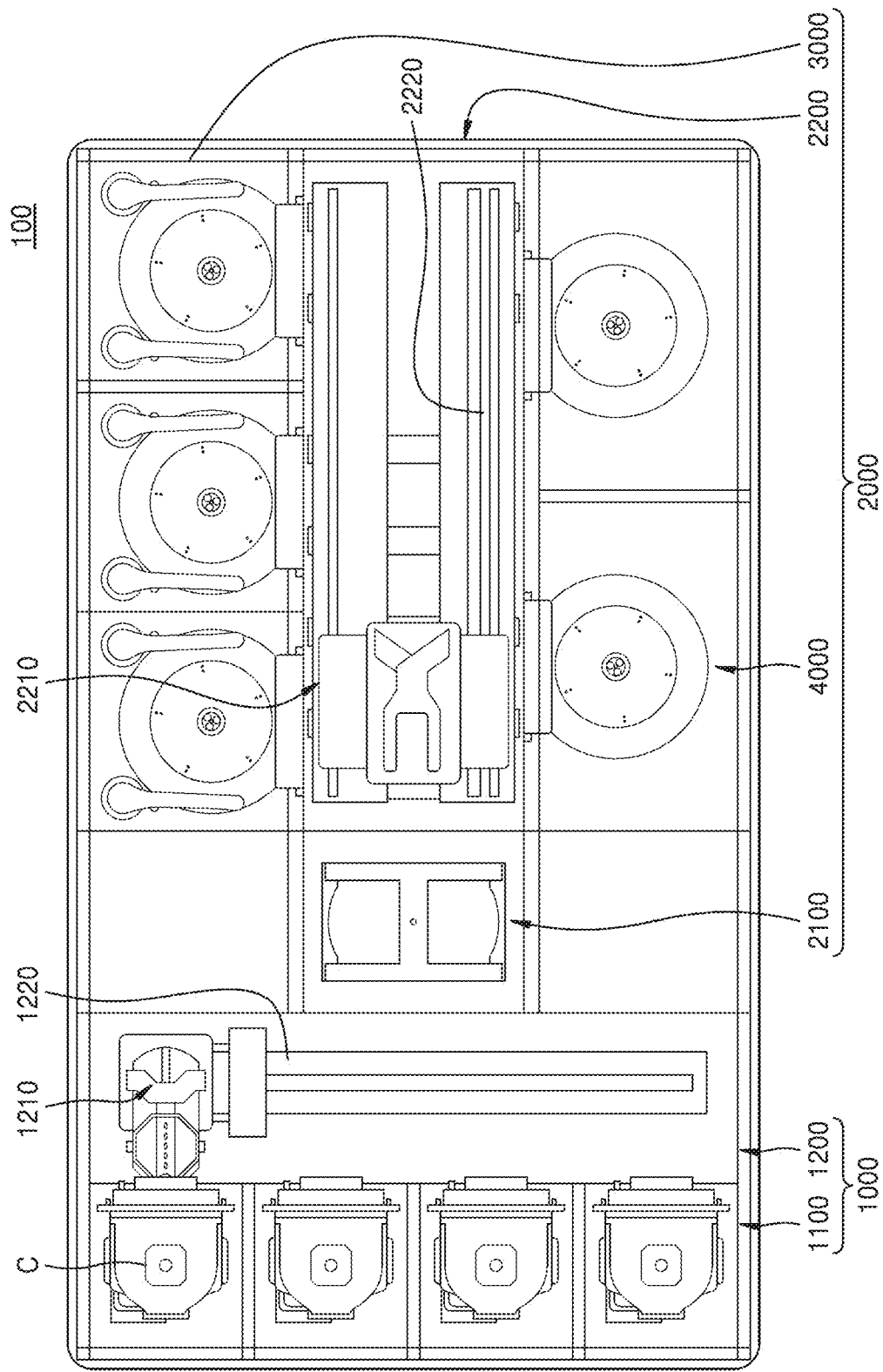
FIG. 1 is a plan view for explaining a substrate processing system according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter, embodiments will be described in detail with reference to the accompanying drawings. The same reference numerals are used for the same components in the drawings, and redundant descriptions thereof will be omitted.

FIG. 1 is a plan view for explaining a substrate processing system 100 according to embodiments.

Referring to FIG. 1, the substrate processing system 100 may include an index module 1000 and a process module 2000.

The index module 1000 may receive a substrate S (see FIG. 2) from the outside and transfer the substrate S (see FIG. 2) to the process module 2000, and the process module 2000 may perform a cleaning process and a drying process using a supercritical fluid.

The index module 1000 is an equipment front end module (EFEM) and may include a load port 1100 and a transfer frame 1200.

The load port 1100 may be accommodate containers C in which the substrate S (see FIG. 2) is stored. As a non-limiting example, the containers C may be front opening unified pods (FOUPs). The containers C may be imported from the outside to the load port 1100 or exported from the load port 1100 to the outside by an overhead transfer (OHT) system.

The transfer frame 1200 may transfer the substrate S (see FIG. 2) between the containers C placed in the load port 1100 and the process module 2000. The transfer frame 1200 may include an index robot 1210 and an index rail 1220. The index robot 1210 may be configured to move on the index rail 1220. Accordingly, the index robot 1210 may move to a position adjacent to one of the process module 2000 and the containers C, from which the substrate S (see FIG. 2) is withdrawn or in which the substrate S (see FIG. 2) is stored, and the process module 2000.

The process module 2000 is a module that processes a substrate to manufacture a semiconductor device, and may include a buffer chamber 2100, a transfer chamber 2200, a plurality of first substrate processing apparatuses 3000, and a plurality of second substrate processing apparatuses 4000.

The buffer chamber 2100 may temporarily store the substrate S (see FIG. 2) transferred from the index module 1000 to the process module 2000 or from the process module 2000 to the index module 1000. The buffer chamber 2100 may include a buffer slot in which the substrate S (see FIG. 2) is placed.

The transfer chamber 2200 may transfer the substrate S (see FIG. 2) to the buffer chamber 2100, the first substrate processing apparatuses 3000, and the second substrate processing apparatuses 4000, which are arranged adjacent to a transfer rail 2220. The transfer chamber 2200 may include a transfer robot 2210 and the transfer rail 2220. The transfer robot 2210 may move to a position adjacent to the first substrate processing apparatuses 3000 and the second substrate processing apparatuses 4000 on the transfer rail 2220 so as to transfer the substrate S (see FIG. 2) to the first substrate processing apparatuses 3000 and the second substrate processing apparatuses 4000.

The plurality of first substrate processing apparatuses 3000 and the plurality of second substrate processing apparatuses 4000 may perform a cleaning process. The cleaning process may be sequentially performed by one of the plurality of first substrate processing apparatuses 3000 and one of the plurality of second substrate processing apparatuses 4000. Each of the plurality of first substrate processing apparatuses 3000 may be configured to perform a cleaning process including a chemical process, a rinsing process, and an organic solvent process on the substrate S (see FIG. 2), and each of the plurality of second substrate processing apparatuses 4000 may be configured to perform a drying process using a supercritical fluid on the substrate S (see FIG. 2) on which the cleaning process has been performed.

The plurality of first substrate processing apparatuses 3000 and the plurality of second substrate processing apparatuses 4000 may be arranged along a side surface of the transfer chamber 2200. For example, the plurality of first substrate processing apparatuses 3000 and the second substrate processing apparatuses 4000 may be apart from each other with the transfer chamber 2200 therebetween.

The number and arrangement of each of the first substrate processing apparatuses 3000 and the second substrate processing apparatuses 4000 are not limited to the above-described examples, and may be appropriately changed in consideration of various factors, such as the footprint and process efficiency of the substrate processing system 100.

Figure 2:
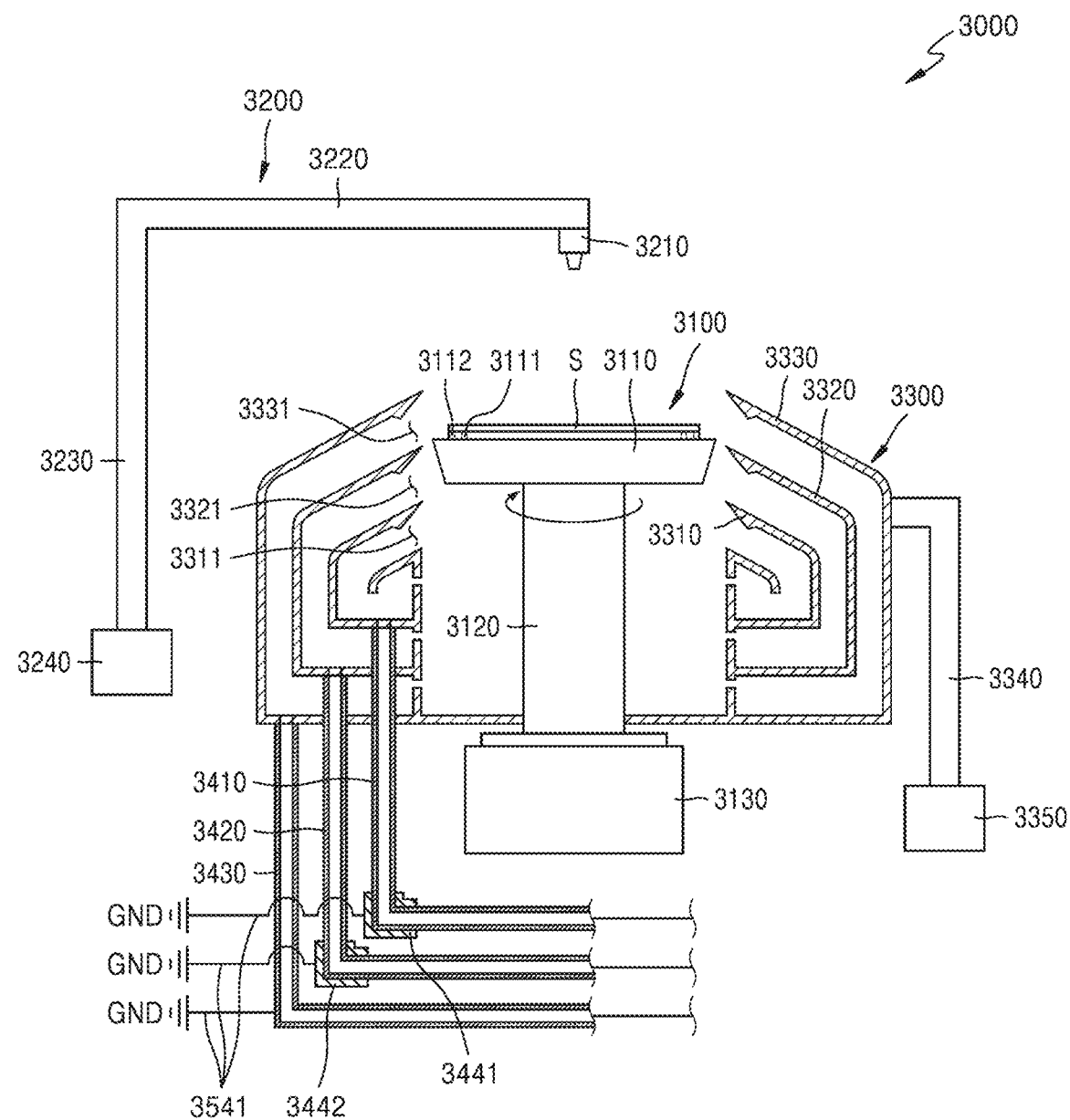
FIG. 2 is a cross-sectional view for explaining a first substrate processing apparatus of FIG. 1.

FIG. 2 is a cross-sectional view for explaining the first substrate processing apparatus 3000 of FIG. 1.

Figure 3:
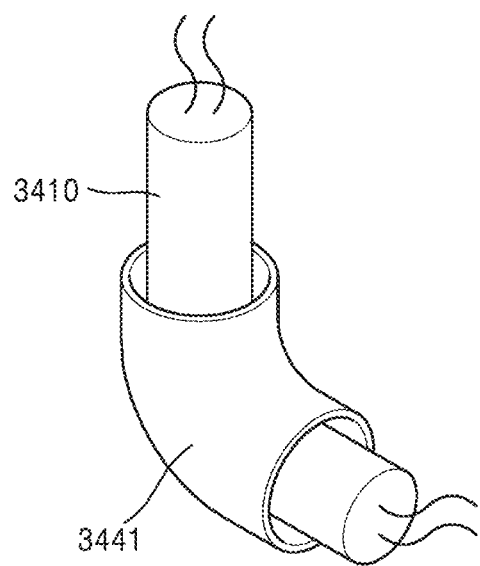
FIG. 3 is a perspective view showing a first static electricity eliminator and a first pipe.

FIG. 3 is a perspective view showing a first static electricity eliminator 3441 and a first pipe 3410.

Referring to FIGS. 2 and 3, the first substrate processing apparatus 3000 may perform a chemical process, a rinsing process, and an organic solvent process. The first substrate processing apparatus 3000 may selectively perform only some of the chemical process, the rinsing process, and the organic solvent process.

In this regard, the chemical process is a process of removing foreign substances on the substrate S by providing a cleaning agent to the substrate S, the rinsing process is a process of removing a cleaning agent remaining on the substrate S by providing a rinse agent to the substrate S, and the organic solvent process is a process of replacing a rinse agent remaining between circuit patterns of the substrate S with an organic solvent having a surface tension lower than a surface tension of the rinse agent by providing the organic solvent to the substrate S.

A substrate supporter 3100 supports and fixes the substrate S, and may rotate the substrate S in a direction perpendicular to an upper surface of the substrate S as an axis. The substrate supporter 3100 may include a support plate 3110, a support pin 3111, a chucking pin 3112, a rotation shaft 3120, and a rotary actuator 3130.

In this regard, the substrate S may be a semiconductor wafer. The substrate S may include, for example, silicon (Si). The substrate S may include a semiconductor material, such as germanium (Ge), or a compound semiconductor, such as silicon carbide (SiC), gallium arsenide (GaAs), indium arsenide (InAs), and indium phosphide (InP).

The support pin 3111 and the chucking pin 3112 may be arranged on an upper surface of the support plate 3110. The support pin 3111 may support the substrate S, and the chucking pin 3112 may fix the supported substrate S. According to embodiments, the support pin 3111 and the chucking pin 3112 may facilitate pick and place of the substrate S, and a rear surface of the substrate S may be apart from the upper surface of the support plate 3110 to prevent contamination of the rear surface of the substrate S.

The support plate 3110 may be connected to the rotation shaft 3120. The rotation shaft 3120 may transfer torque from the rotary actuator 3130 to the support plate 3110 so as to rotate the support plate 3110. Accordingly, the substrate S seated on the support plate 3110 may rotate. At this time, the chucking pin 3112 may prevent deviation of the substrate S from its regular position.

A processing solution feeder 3200 may be configured to spray a processing solution onto the substrate S. The processing solution may include a cleaning agent, a rinse agent, and an organic solvent. The processing solution feeder 3200 may include a nozzle 3210, a nozzle bar 3220, a nozzle shaft 3230, and a nozzle shaft actuator 3240.

As a non-limiting example, the cleaning agent may include hydrogen peroxide ($H_2O_2$), ammonia ($NH_4OH$), hydrochloric acid (HCl), sulfuric acid ($H_2SO_4$), and hydrofluoric acid (HF). As a non-limiting example, the rinse agent may include pure water.

As a non-limiting example, the organic solvent may include isopropyl alcohol (IPA), ethylene glycol, 1-propanol, tetra hydraulic furanc (THF), 4-hydroxyl 4-methyl 2-pentanone, 1-butanol, 2-butanol, methanol, ethanol, n-propyl alcohol, and dimethylether.

The nozzle 3210 may be located on a lower surface of one end of the nozzle bar 3220. The nozzle bar 3220 may be couple to the nozzle shaft 3230. The nozzle shaft actuator 3240 may adjust the position of the nozzle 3210 by lifting and lowering or rotating the nozzle shaft 3230.

When a processing solution is supplied to the substrate S by the processing solution feeder 3200, the substrate supporter 3100 may rotate the substrate S. The processing solution may be uniformly distributed over the entire area of the substrate S via spin coating. When the substrate S rotates, some of the processing solution may scatter from the substrate S. The processing solution may be recovered by a recovery apparatus 3300.

The recovery apparatus 3300 may include first to third recovery containers 3310, 3320, and 3330, a lift bar 3340, and a lift actuator 3350.

The first recovery container 3310 may have a ring shape surrounding the substrate supporter 3100. The second recovery container 3320 may have a ring shape surrounding the first recovery container 3310. The third recovery container 3330 may have a ring shape surrounding the second recovery container 3320. The first to third recovery containers 3310, 3320, and 3330 may be fixed to each other.

An internal space of the first recovery container 3310 may be a first inlet 3311 of the first recovery container 3310 into which a processing solution flows, a space between the first recovery container 3310 and the second recovery container 3320 may be a second inlet 3321 of the second recovery container 3320 into which a processing solution flows, and a space between the second recovery container 3320 and the third recovery container 3330 may be a third inlet 3331 of the third recovery container 3330 into which a processing solution is introduced.

The third inlet 3331 may be disposed above the second inlet 3321 (i.e., arranged closer to the nozzle 3210), and the second inlet 3321 may be disposed above the first inlet 3311. Accordingly, the first to third recovery containers 3310, 3320, and 3330 may recovery different processing solutions from among processing solutions.

The lift bar 3340 may be connected to the first to third recovery containers 3310, 3320, and 3330. The lift bar 3340 may transfer driving force from the lift actuator 3350 to the first to third recovery containers 3310, 3320, and 3330 so as to move the first to third recovery containers 3310, 3320, and 3330 up and down.

When the substrate S is placed on the substrate supporter 3100 or is picked up from the substrate supporter 3100, the lift bar 3340 and the lift actuator 3350 may lower the first to third recovery containers 3310, 3320, and 3330 so that the substrate supporter 3100 protrudes upward with respect to the first to third recovery containers 3310, 3320, and 3330.

In addition, while the substrate S is being processed, the lift bar 3340 and the lift actuator 3350 may adjust the positions of the first to third recovery containers 3310, 3320, and 3330 so that a processing solution scattered from the substrate S may flow into the first to third recovery containers 3310, 3320, and 3330.

The first pipe 3410 may be connected to a lower surface of the first recovery container 3310, a second pipe 3420 may be connected to a lower surface of the second recovery container 3320, and a third pipe 3430 may be connected to a lower surface of the third recovery container 3330. According to embodiments, the first to third pipes 3410, 3420, and 3430 may transfer processing solutions collected from the first to third recovery containers 3310, 3320, and 3330 to a chemical recycling system.

According to embodiments, the first to third recovery containers 3310, 3320, and 3330 may recover different materials from a processing solution, and accordingly, the first to third pipes 3410, 3420, and 3430 may transfer different materials from a processing solution. For example, the first pipe 3410 may transfer a cleaning agent, the second pipe 3420 may transfer a rinse agent, and the third pipe 3430 may transfer an organic solvent. As another example, the first pipe 3410 and the second pipe 3420 may transfer different cleaning agents, and the third pipe 3430 may transfer a combination of a cleaning agent, a rinse agent, and an organic solvent.

According to embodiments, the first and second pipes 3410 and 3420 may include a material different from that of the third pipe 3430. For example, the first and second pipes 3410 and 3420 may include an insulating material, and the third pipe 3430 may include a conductive material.

As a non-limiting example, the first and second pipes 3410 and 3420 may include a corrosion-resistant material, such as polyvinyl chloride (PVC). The third pipe 3430 may include a carbon fiber pipe. The third pipe 3430 may transfer highly corrosive materials, such as IPA.

According to embodiments, since the third pipe 3430 is a carbon fiber pipe, the third pipe 3430 may safely transfer materials, such as IPA. In addition, since the first and second pipes 3410 and 3420 are PVC pipes, the first and second pipes 3410 and 3420 may be provided at a low cost.

According to embodiments, the first static electricity eliminator 3441 may be in contact with the first pipe 3410. According to embodiments, a second static electricity eliminator 3442 may be in contact with the second pipe 3420. According to embodiments, the first static electricity eliminator 3441 may surround a portion of the first pipe 3410. According to embodiments, the second static electricity eliminator 3442 may surround a portion of the second pipe 3420.

According to embodiments, the first and second static electricity eliminators 3441 and 3442 may include a material capable of discharging electric charges accumulated in the first and second pipes 3410 and 3420. According to embodiments, the first and second static electricity eliminators 3441 and 3442 may include a conductive material. According to embodiments, the first and second static electricity eliminators 3441 and 3442 may include carbon, silicon, and metal. As a non-limiting example, each of the first and second static electricity eliminators 3441 and 3442 may include a conductive thread, a conductive film, and a conductive casting (i.e., an element manufactured by a molding process).

According to embodiments, the first static electricity eliminator 3441 may be in contact with a portion of the first pipe 3410 in which electrostatic charges are easily accumulated. According to embodiments, the second static electricity eliminator 3442 may be in contact with a portion of the second pipe 3420 in which electrostatic charges are easily accumulated. Accordingly, the electrostatic charges induced in the first and second pipes 3410 and 3420 may be removed.

As an example, friction between a processing solution and a bent portion of each of the first and second pipes 3410 and 3420 may be greater than friction between the processing solution and a straight portion of each of the first and second pipes 3410 and 3420. For example, friction between a processing solution and the first and second pipes 3410 and 3420 may be maximized at a bent portion of each of the first and second pipes 3410 and 3420, and accordingly, electrostatic charges such as triboelectricity may be easily induced in the bent portion of each of the first and second pipes 3410 and 3420.

According to embodiments, the first static electricity eliminator 3441 may surround a bent portion of the first pipe 3410. According to embodiments, the second static electricity eliminator 3442 may surround a bent portion of the second pipe 3420. According to embodiments, the first static electricity eliminator 3441 may be in contact with a bent portion of the first pipe 3410. According to embodiments, the second static electricity eliminator 3442 may be in contact with a bent portion of the second pipe 3420.

According to embodiments, first conductive lines 3541 may be connected to the third pipe 3430 and the first and second static electricity eliminators 3441 and 3442, respectively. As described above, the third pipe 3430 includes a conductive material, and thus, the first conductive line 3541 may be directly connected to the third pipe 3430. A ground potential GND may be applied to the first conductive lines 3541. The first conductive lines 3541 may provide a path for discharging electric charges accumulated in the third pipe 3430 and the first and second static electricity eliminators 3441 and 3442. As a non-limiting example, the first conductive lines 3541 may include copper (Cu).

According to embodiments, the first substrate processing apparatus 3000 may further include a controller. The controller may be implemented by hardware, firmware, software, or any combination thereof. For example, the controller may include a computing apparatus, such as a workstation computer, a desktop computer, a laptop computer, a tablet computer. The controller may include a simple controller, a complex processor such as a microprocessor, a central processing unit (CPU), and a graphics processing unit (GPU), a processor configured by software, dedicated hardware, or firmware. The controller may be implemented by, for example, a general-purpose computer or application-specific hardware, such as a digital signal processor (DSP), a field-programmable gate array (FPGA), and an application-specific integrated circuit (ASIC).

Firmware, software, routines, or instructions may be configured to perform the operations described above with respect to the controller or any process described below. For example, the controller may be implemented by software configured to generate signals for controlling driving of the rotary actuator 3130, driving of the nozzle shaft actuator 3240, and driving of the lift actuator 3350. The operations of the controller may result from a computing apparatus, a processor, and other apparatuses executing firmware, software, routines, and instructions.

According to embodiments, the first substrate processing apparatus 3000 may include an Ethernet for control automation technology (EtherCAT) network for communication with an external server.

According to embodiments, electrostatic charges generated from the first and second pipes 3410 and 3420 may be effectively removed by the first and second static electricity eliminators 3441 and 3442. Accordingly, noise with respect to the rotary actuator 3130, the nozzle shaft actuator 3240, the lift actuator 3350, and the controller and communication failure of the EtherCAT network, which are caused by the electrostatic charges, may be prevented.

Figure 4:
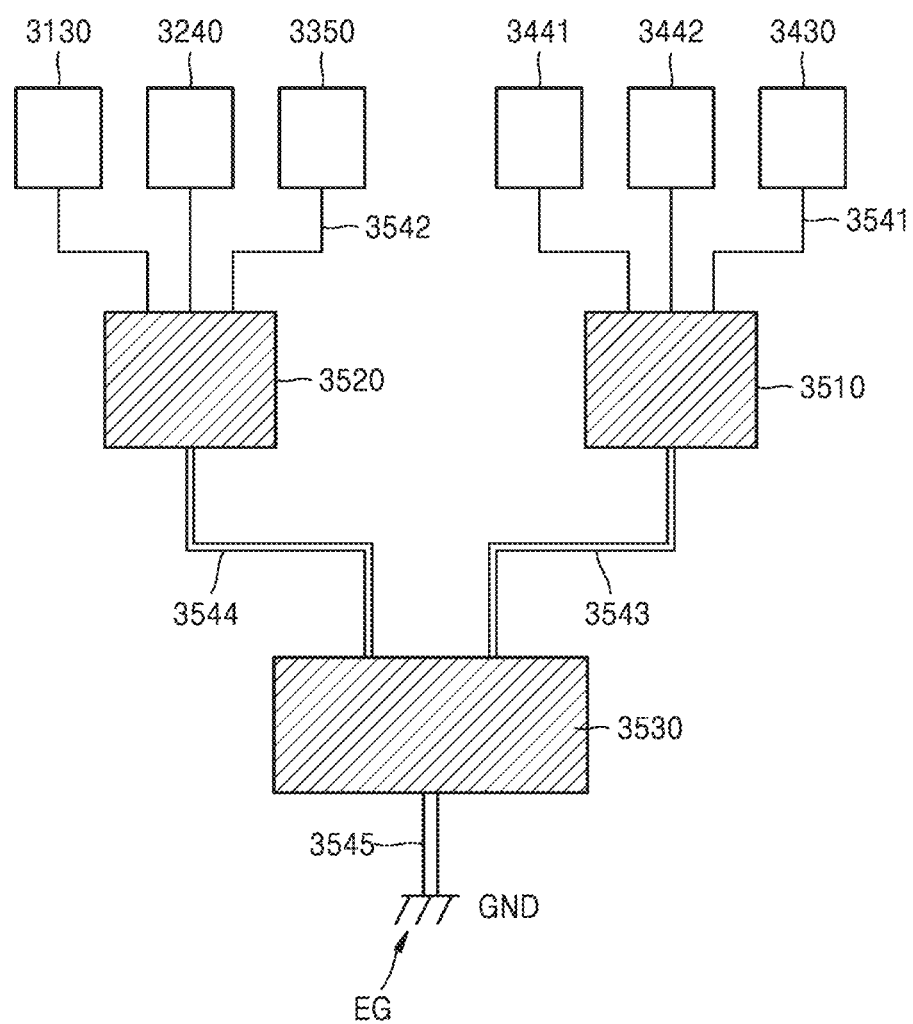
FIG. 4 is a block diagram for explaining static electricity eliminating action of a first substrate processing apparatus, according to embodiments.

FIG. 4 is a block diagram for explaining static electricity eliminating action of the first substrate processing apparatus 3000, according to embodiments.

Referring to FIGS. 2 and 4, the first substrate processing apparatus 3000 may include a first ground bar 3510, a second ground bar 3520, a third ground bar 3530, the first conductive lines 3541, second conductive lines 3542, a third conductive line 3543, a fourth conductive line 3544, and a fifth conductive line 3545.

According to embodiments, the first ground bar 3510 may be configured to discharge electric charges accumulated in the first and second static electricity eliminators 3441 and 3442. A first terminal of each of the first conductive lines 3541 may be connected to one of the third pipe 3430 and the first and second static electricity eliminators 3441 and 3442. A second terminal of each of the first conductive lines 3541 may be connected to the first ground bar 3510. The third pipe 3430 and the first and second static electricity eliminators 3441 and 3442 may be electrically connected to the first ground bar 3510 via the first conductive lines 3541.

According to embodiments, the second ground bar 3520 may provide the ground potential GND for the operation of electronic components of the first substrate processing apparatus 3000. For example, the second ground bar 3520 may provide the ground potential GND to electronic components of the first substrate processing apparatus 3000 including the rotary actuator 3130, the nozzle shaft actuator 3240, the lift actuator 3350, the controller, and various sensors.

According to embodiments, the second ground bar 3520 may be electrically connected to electronic components of the first substrate processing apparatus 3000 including the rotary actuator 3130, the nozzle shaft actuator 3240, the lift actuator 3350, the controller, and various sensors via the second conductive lines 3542. According to embodiments, a first terminal of each of the second conductive lines 3542 may be connected to one of electronic components of the first substrate processing apparatus 3000 including the rotary actuator 3130, the nozzle shaft actuator 3240, the lift actuator 3350, the controller, and various sensors, and a second terminal of each of the second conductive lines 3542 may be connected to the second ground bar 3520.

According to embodiments, a first terminal of the third conductive line 3543 may be connected to the first ground bar 3510, and a second terminal of the third conductive line 3543 may be connected to the third ground bar 3530.

According to embodiments, the first ground bar 3510 may be electrically connected to the third ground bar 3530 via the third conductive line 3543.

A first terminal of the fourth conductive line 3544 may be connected to the second ground bar 3520, and a second terminal of the fourth conductive line 3544 may be connected to the third ground bar 3530. According to embodiments, the second ground bar 3520 may be electrically connected to the third ground bar 3530 via the fourth conductive line 3544.

According to embodiments, the first ground bar 3510 and the second ground bar 3520 may be apart from each other. According to embodiments, the first ground bar 3510 and the second ground bar 3520 may not be directly electrically connected to each other. According to embodiments, the first ground bar 3510 may be electrically connected to the second ground bar 3520 via the third conductive line 3543, the third ground bar 3530, and the fourth conductive line 3544.

The fifth conductive line 3545 may be connected to the third ground bar 3530. According to embodiments, the fifth conductive line 3545 may apply the ground potential GND to the third ground bar 3530. According to embodiments, the fifth conductive line 3545 may provide a path for discharging electrostatic charges removed from the first and second pipes 3410 and 3420 by the first and second static electricity eliminators 3441 and 3442.

According to embodiments, the fifth conductive line 3545 may be connected to an earth ground EG. According to embodiments, the earth ground EG may be a charge reservoir storing electrostatic charges transferred from the first and second static electricity eliminators 3441 and 3442. According to embodiments, the earth ground EG may be a ground on a power system, and at the same time, the second ground bar 3520 may be a chassis ground providing a ground potential for the operation of electronic components of the first substrate processing apparatus 3000 including the rotary actuator 3130, the nozzle shaft actuator 3240, the lift actuator 3350, the controller, and various sensors.

According to embodiments, a cross-sectional area of each of the first conductive lines 3541 may be substantially the same as a cross-sectional area of each of the second conductive lines 3542. According to embodiments, a resistance per unit length of each of the first conductive lines 3541 may be substantially the same as a resistance per unit length of each of the second conductive lines 3542.

According to embodiments, respective sizes and resistances of the first ground bar 3510 and the second ground bar 3520 may be substantially the same. According to embodiments, the first ground bar 3510 and the second ground bar 3520 may include the same material. According to embodiments, the first ground bar 3510 and the second ground bar 3520 may include a conductive material, such as a metal material. According to embodiments, a resistance of the first ground bar 3510 and a resistance of the second ground bar 3520 may be substantially the same.

According to embodiments, a cross-sectional view of the third conductive line 3543 may be substantially the same as a cross-sectional view of the fourth conductive line 3544. According to embodiments, a resistance per unit length of the third conductive line 3543 may be substantially the same as a resistance per unit length of the fourth conductive line 3544.

According to embodiments, a cross-sectional area of each of the third and fourth conductive lines 3543 and 3544 may be greater than a cross-sectional area of each of the first and second conductive lines 3541 and 3542. According to embodiments, a resistance per unit length of each of the third and fourth conductive lines 3543 and 3544 may be less than a resistance per unit length of each of the first and second conductive lines 3541 and 3542.

According to embodiments, a size of the third ground bar 3530 may be greater than a size of each of the first and second ground bars 3510 and 3520. According to embodiments, a resistance of the third ground bar 3530 may be less than a resistance of each of the first and second ground bars 3510 and 3520.

According to embodiments, a cross-sectional area of the fifth conductive line 3545 may be greater than a cross-sectional area of each of the third and fourth conductive lines 3543 and 3544. According to embodiments, a resistance per unit length of the fifth conductive line 3545 may be less than a resistance per unit length of each of the third and fourth conductive lines 3543 and 3544.

According to embodiments, since the first ground bar 3510 is not directly connected to the second ground bar 3520, electrostatic charges discharged via the first ground bar 3510 may be prevented from being transferred to electronic components of the first substrate processing apparatus 3000 including the rotary actuator 3130, the nozzle shaft actuator 3240, the lift actuator 3350, the controller, and various sensors via the second ground bar 3520.

In addition, since the resistance per unit length of the fifth conductive line 3545 is less than the resistance per unit length of each of the third and fourth conductive lines 3543 and 3544, most of electrostatic charges that reach the third ground bar 3530 via the third conductive line 3543 may flow to the earth ground EG via the fifth conductive line 3545 instead of flowing to the second ground bar 3520 via the fourth conductive line 3544. Accordingly, most of electrostatic charges discharged via the first ground bar 3510 may be discharged to the earth ground EG via the first conductive lines 3541, the third conductive line 3543, and the fifth conductive line 3545.

According to embodiments, since an arc caused by accumulation of electrostatic charges generated from the first to third pipes 3410, 3420, and 3430 is prevented, the reliability of the first substrate processing apparatus 3000 may be improved.

Figure 5:
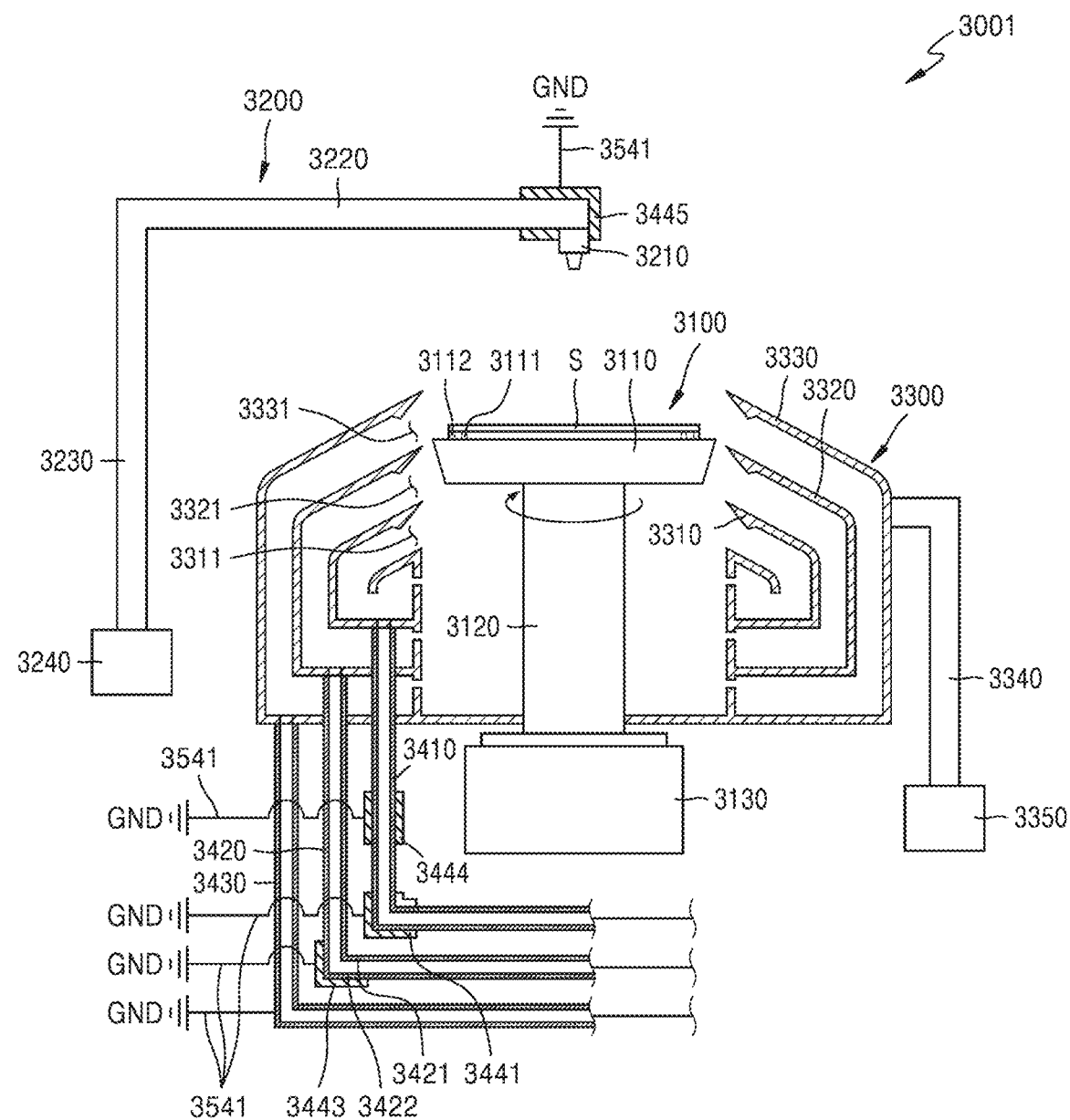
FIG. 5 is a cross-sectional view for explaining a first substrate processing apparatus according to other embodiments.

FIG. 5 is a schematic cross-sectional view for explaining a first substrate processing apparatus 3001 according to other embodiments.

Referring to FIG. 5, the first substrate processing apparatus 3001 may include the substrate supporter 3100, the processing solution feeder 3200, the first to third recovery containers 3310, 3320, and 3330, the first to third pipes 3410, 3420, and 3430, and first to fourth static electricity eliminators 3441', 3443, 3444, and 3445.

The substrate supporter 3100, the processing solution feeder 3200, the first to third recovery containers 3310, 3320, and 3330, and the first to third pipes 3410, 3420, and 3430 are substantially the same as the substrate supporter 3100, the processing solution feeder 3200, the first to third recovery containers 3310, 3320, and 3330, and the first to third pipes 3410, 3420, and 3430, respectively, which are described with reference to FIGS. 2 to 4, and redundant descriptions thereof will be omitted.

According to embodiments, the first static electricity eliminator 3441' may further include a first portion surrounding a bent portion of the first pipe 3410 and a second portion surrounding a straight portion of the first pipe 3410. The second portion of the first static electricity eliminator 3441' may extend along the first pipe 3410 from the bent portion of the first pipe 3410. The second portion of the first static electricity eliminator 3441' may be in contact with the straight portion of the first pipe 3410.

According to embodiments, the second static electricity eliminator 3443 may cover a portion of a bent portion of the second pipe 3420. According to embodiments, the second static electricity eliminator 3443 may cover an outer surface 3422 of the bent portion of the second pipe 3420 and expose an inner surface 3421 thereof. In this regard, the inner surface 3421 of the bent portion of the second pipe 3420 may be in a direction in which the second pipe 3420 is bent, and the outer surface 3422 may be opposite to the inner surface 3421.

According to embodiments, the second static electricity eliminator 3443 may be in contact with the outer surface 3422 of the bent portion of the second pipe 3420, and may be apart from the inner surface 3421 of the bent portion of the second pipe 3420. According to embodiments, the manufacturing cost of the second static electricity eliminator 3443 may be reduced by providing the second static electricity eliminator 3443 covering only the outer surface 3422 of the bent portion of the second pipe 3420.

According to embodiments, the third static electricity eliminator 3444 may cover a portion of the first pipe 3410. According to embodiments, the third static electricity eliminator 3444 may be apart from the bent portion of the first pipe 3410. According to embodiments, the third static electricity eliminator 3444 may cover a portion of the straight portion of the first pipe 3410, wherein the portion is where electrostatic charges such as triboelectricity are easily generated. According to embodiments, the third static electricity eliminator 3444 may be in contact with a portion of the straight portion of the first pipe 3410, wherein the portion is where electrostatic charges such as triboelectricity are easily generated. According to embodiments, the third static electricity eliminator 3444 may be additionally provided on, other than the bent portion of the first pipe 3410, a portion of the first pipe 3410 where electrostatic charges are easily generated, and accordingly, electrostatic charges generated by the first pipe 3410 may be more effectively removed.

According to embodiments, the fourth static electricity eliminator 3445 may cover a portion of the processing solution feeder 3200. According to embodiments, the fourth static electricity eliminator 3445 may be in contact with a portion of the processing solution feeder 3200. According to embodiments, the fourth static electricity eliminator 3445 may cover a portion of the processing solution feeder 3200, such as a joint between the nozzle 3210 and the nozzle bar 3220, wherein the portion is where electrostatic charges are easily generated. According to embodiments, the fourth static electricity eliminator 3445 may be in contact with a portion of the processing solution feeder 3200, such as a joint between the nozzle 3210 and the nozzle bar 3220, wherein the portion is where electrostatic charges are easily generated.

The additional first conductive lines 3541 may be connected to the second to fourth static electricity eliminators 3443, 3444, and 3445, respectively. The additional first conductive lines 3541 may apply the ground potential GND to the second to fourth static electricity eliminators 3443, 3444, and 3445. The additional first conductive lines 3541 may provide a path for discharging electrostatic charges to the second to fourth static electricity eliminators 3443, 3444, and 3445. The additional first conductive lines 3541 may be connected to the first ground bar 3510 (see FIG. 4).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
   a substrate supporter comprising a support plate configured to support a substrate and a rotary actuator configured to rotate the support plate;
   a processing solution feeder configured to supply a processing solution to the substrate;
   a first recovery container surrounding the substrate supporter and configured to recover scattered processing solution from the substrate;
   a lift actuator configured to move the first recovery container up and down with respect to the substrate supporter;
   a first pipe connected to the first recovery container and comprising an insulating material;
   a first static electricity eliminator in contact with the first pipe; and
   a first conductive line connected to the first static electricity eliminator,
   wherein the first static electricity eliminator comprises a conductive material and covers a bent portion of the first pipe,
   wherein the first conductive line provides a path for discharging electrostatic charges generated by the first pipe,
   the apparatus further comprising a first ground bar configured to receive a ground potential,
   wherein the first static electricity eliminator is connected to the first ground bar via the first conductive line,
   the apparatus further comprising a second ground bar connected to the rotary actuator and the lift actuator and configured to provide the ground potential to the rotary actuator and the lift actuator,
   wherein the first ground bar and the second ground bar are apart from each other.

2. The substrate processing apparatus of claim 1, further comprising second conductive lines connecting the rotary actuator and the lift actuator to the second ground bar.

3. The substrate processing apparatus of claim 2, further comprising:
   a third ground bar;
   a third conductive line connecting the third ground bar to the first ground bar;
   a fourth conductive line connecting the third ground bar to the second ground bar; and
   a fifth conductive line connecting the third ground bar to an earth ground.

4. The substrate processing apparatus of claim 3, wherein a resistance per unit length of the third conductive line is less than a resistance per unit length of the first conductive line, and
   a resistance per unit length of the fourth conductive line is less than a resistance per unit length of each of the second conductive lines.

5. The substrate processing apparatus of claim 3, wherein a resistance per unit length of the fifth conductive line is less than a resistance per unit length of the third conductive line, and the resistance per unit length of the fifth conductive line is less than the resistance per unit length of the fourth conductive line.

6. The substrate processing apparatus of claim 3, wherein the first ground bar is indirectly connected to the second ground bar via the third conductive line, the third ground bar, and the fourth conductive line.

7. A substrate processing apparatus comprising:
a substrate supporter configured to support a substrate;
a processing solution feeder comprising a nozzle configured to supply a processing solution to the substrate;
a first recovery container surrounding the substrate supporter and configured to recover scattered processing solution from the substrate;
a second recovery container surrounding the first recovery container and configured to recover the scattered processing solution from the substrate;
a first pipe connected to the first recovery container and comprising an insulating material;
a second pipe connected to the second recovery container and comprising an insulating material; and
a first static electricity eliminator configured to remove electrostatic charges generated by the first pipe,
wherein the first static electricity eliminator comprises a conductive material, surrounds a bent portion of the first pipe, and is in contact with the bent portion of the first pipe,
wherein the first static electricity eliminator comprises a conductive material and covers a bent portion of the first pipe,
wherein the first conductive line provides a path for discharging electrostatic charges generated by the first pipe,
the apparatus further comprising a first ground bar configured to receive a ground potential,
wherein the first static electricity eliminator is connected to the first ground bar via the first conductive line,
the apparatus further comprising a second ground bar connected to the rotary actuator and the lift actuator and configured to provide the ground potential to the rotary actuator and the lift actuator,
wherein the first ground bar and the second ground bar are apart from each other.

8. The substrate processing apparatus of claim 7, wherein the first static electricity eliminator comprises a first portion surrounding the bent portion of the first pipe and a second portion surrounding a straight portion of the first pipe.

9. The substrate processing apparatus of claim 7, further comprising a second static electricity eliminator configured to remove electrostatic charges generated by the second pipe,
wherein the second static electricity eliminator covers a portion of a bent portion of the second pipe.

10. The substrate processing apparatus of claim 9, wherein the second static electricity eliminator is in contact with an outer surface of the bent portion of the second pipe and is apart from an inner surface of the bent portion of the second pipe.

11. The substrate processing apparatus of claim 10, further comprising a third static electricity eliminator configured to remove electrostatic charges generated by the first pipe,
wherein the third static electricity eliminator is apart from the bent portion of the first pipe.

12. The substrate processing apparatus of claim 11, further comprising a fourth static electricity eliminator configured to remove electrostatic charges generated by the processing solution feeder,
wherein the fourth static electricity eliminator is in contact with the nozzle.

13. The substrate processing apparatus of claim 12, further comprising a plurality of first conductive lines configured to provide a path for discharging electrostatic charges to the first to fourth static electricity eliminators.

14. A substrate processing apparatus comprising:
a substrate supporter comprising a support plate configured to support a substrate and a rotary actuator configured to rotate the support plate;
a processing solution feeder configured to supply a processing solution to the substrate;
a first recovery container surrounding the substrate supporter and configured to recover scattered processing solution from the substrate;
a second recovery container surrounding the first recovery container and configured to recover the scattered processing solution from the substrate;
a lift actuator configured to move the first and second recovery containers up and down with respect to the substrate supporter;
a first pipe connected to the first recovery container and comprising an insulating material;
a second pipe connected to the second recovery container and comprising an insulating material;
a first static electricity eliminator in contact with a bent portion of the first pipe;
a second static electricity eliminator in contact with a bent portion of the second pipe;
a plurality of first conductive lines providing a path for discharging electrostatic charges to the first and second static electricity eliminators;
a plurality of second conductive lines configured to provide a ground potential for operating the rotary actuator and the lift actuator to the rotary actuator and the lift actuator;
a first ground bar connected to the plurality of first conductive lines;
a second ground bar connected to the plurality of second conductive lines and apart from the first ground bar;
a third conductive line connected to the first ground bar;
a fourth conductive line connected to the second ground bar;
a third ground bar connected to the third conductive line and the fourth conductive line; and
a fifth conductive line connecting the third ground bar to an earth ground,
wherein the first static electricity eliminator comprises a conductive material and covers a bent portion of the first pipe,
wherein the first conductive line provides a path for discharging electrostatic charges generated by the first pipe,
the apparatus further comprising a first ground bar configured to receive a ground potential,
wherein the first static electricity eliminator is connected to the first ground bar via the first conductive line,
the apparatus further comprising a second ground bar connected to the rotary actuator and the lift actuator and configured to provide the ground potential to the rotary actuator and the lift actuator,
wherein the first ground bar and the second ground bar are apart from each other.

15. The substrate processing apparatus of claim 14, wherein a resistance per unit length of the fifth conductive line is less than a resistance per unit length of each of the third and fourth conductive lines, and a resistance per unit length of each of the third and fourth conductive lines is less than a resistance per unit length of each of the first and second conductive lines.

* * * * *